(12) United States Patent
Hamor et al.

(10) Patent No.: US 12,142,336 B2
(45) Date of Patent: Nov. 12, 2024

(54) INTELLIGENT MEMORY DEVICE TEST RACK

(71) Applicant: MICRON TECHNOLOGY, INC., Boise, ID (US)

(72) Inventors: Gary D. Hamor, Mead, OR (US); Michael R. Spica, Eagle, ID (US); Donald Shepard, Longmont, CO (US); Patrick Caraher, Longmont, CO (US); João Elmiro da Rocha Chaves, Middleton, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/716,972

(22) Filed: Apr. 8, 2022

(65) Prior Publication Data
US 2022/0230700 A1 Jul. 21, 2022

Related U.S. Application Data

(63) Continuation of application No. 16/719,707, filed on Dec. 18, 2019, now Pat. No. 11,328,789.

(51) Int. Cl.
| | |
|---|---|
| G11C 29/44 | (2006.01) |
| G06F 9/50 | (2006.01) |
| G11C 29/22 | (2006.01) |
| G11C 29/36 | (2006.01) |
| G11C 29/56 | (2006.01) |

(52) U.S. Cl.
CPC ............ *G11C 29/44* (2013.01); *G06F 9/5016* (2013.01); *G11C 29/22* (2013.01); *G11C 29/36* (2013.01); *G11C 29/56* (2013.01); *G11C 2029/5602* (2013.01)

(58) Field of Classification Search
CPC ............ G11C 29/56; G11C 2029/5602; G01R 31/2834
See application file for complete search history.

(56) References Cited

U.S. PATENT DOCUMENTS

| | | | |
|---|---|---|---|
| 7,619,432 B2 | 11/2009 | Roberts | |
| 8,125,236 B2 | 2/2012 | Lee et al. | |
| 8,904,085 B2 | 12/2014 | Hobbet et al. | |
| 9,726,717 B2 * | 8/2017 | Maulsby | G11C 29/06 |
| 9,817,025 B2 * | 11/2017 | Isaac | G01R 31/2889 |

(Continued)

*Primary Examiner* — Vanthu T Nguyen
(74) *Attorney, Agent, or Firm* — Lowenstein Sandler LLP

(57) ABSTRACT

A detection is made by a processing device allocated to a memory device test board of a distributed test platform that a memory sub-system has engaged with a memory device test resource of the memory device test board. A test is identified to be performed for a memory device of the memory sub-system. The test includes first instructions to be executed by a memory sub-system controller of the memory sub-system in performance of the test and second instructions to be executed by the processing device in performance of the test. The second instructions are to cause one or more test condition components of the memory device test resource to generate one or more test conditions to be applied to the memory device while the memory sub-system executes the first instructions. Responsive to a transmission of the first instructions to the memory sub-system controller, the second instructions are executed.

20 Claims, 8 Drawing Sheets

(56) References Cited

U.S. PATENT DOCUMENTS

| | | |
|---|---|---|
| 10,557,886 B2 | 2/2020 | Nahum et al. |
| 10,672,470 B1 | 6/2020 | Thiruvengadam et al. |
| 2005/0246390 A1* | 11/2005 | House .................... G06F 16/22 |
| 2017/0138998 A1 | 5/2017 | Lin et al. |
| 2018/0313890 A1 | 11/2018 | Wolff |

* cited by examiner

INTELLIGENT MEMORY DEVICE TEST RACK

RELATED APPLICATIONS

This application is a continuation of U.S. patent application Ser. No. 16/719,707, filed Dec. 18, 2019, the entire contents of which is hereby incorporated by reference herein.

TECHNICAL FIELD

Embodiments of the disclosure relate generally to memory sub-systems, and more specifically, relate to an intelligent memory device test rack.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
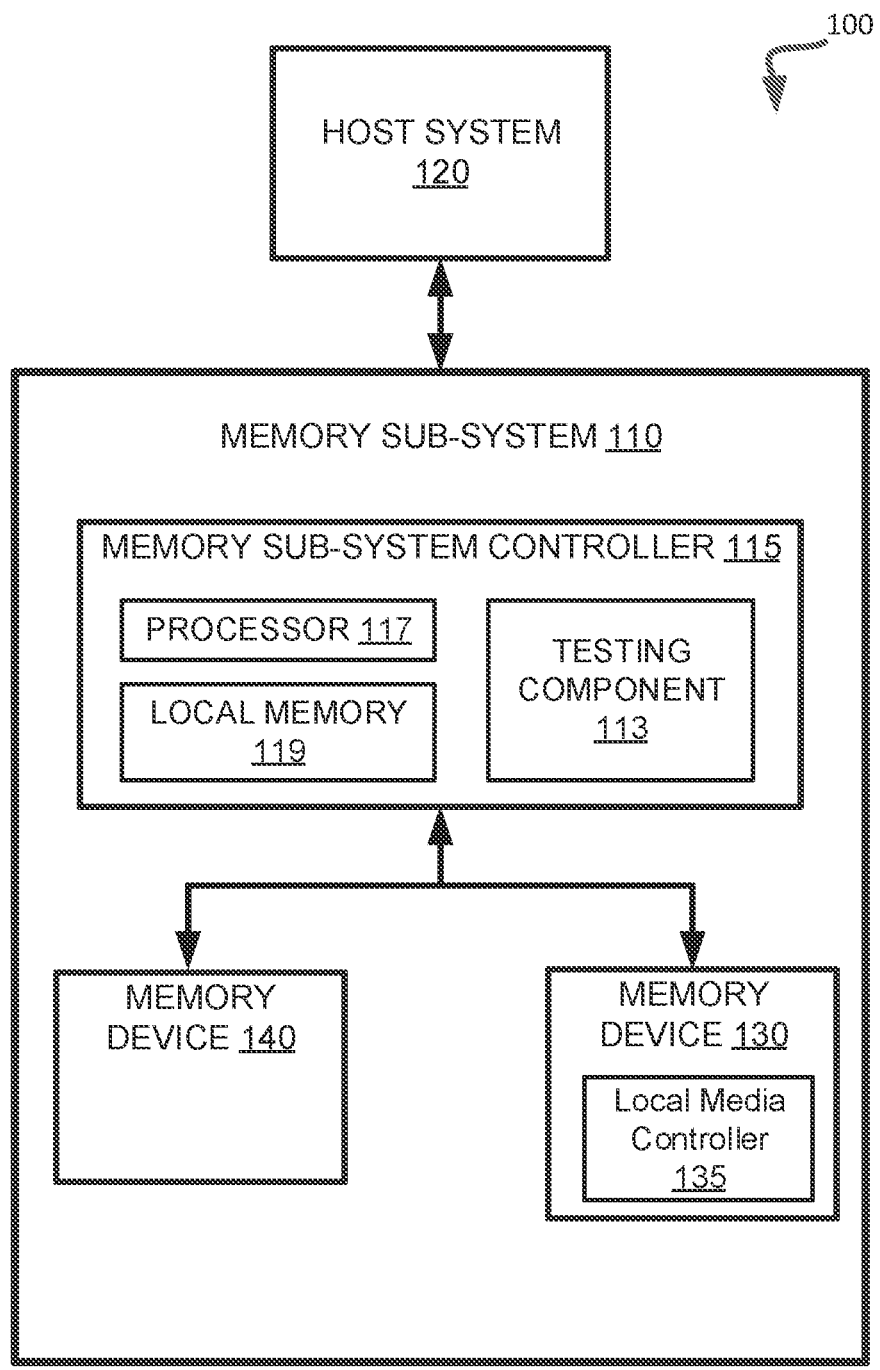
FIG. 1 illustrates an example computing system that includes a memory sub-system, in accordance with some embodiments of the present disclosure.

Aspects of the present disclosure are directed to an intelligent memory device test rack. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

Memory devices that are used in a memory sub-system can be tested before being utilized in the memory sub-system. In a conventional test process, the memory devices can be placed into a chamber (e.g., an oven) that tests the memory device under various temperature conditions. For example, a single chamber can be used to test multiple memory devices at a single time at a particular temperature. The test process can instruct various operations to be performed at the memory devices at the particular temperature. Such operations include, but are not limited to, read operations, write operations, and/or erase operations. The performance and behavior of the memory devices can be observed while the test process is performed. For example, performance characteristics (e.g., read or write latencies) and reliability of data stored at the memory devices can be measured and recorded during and after the test process. However, since the chamber can only subject the memory devices to a single temperature at any particular time, the testing of the memory devices at many different temperatures can require a large amount of time as the test process will need to be performed for each target test temperature. Additionally, the chamber can only perform a single test process at a time. As such, performing different tests of the memory devices at different operating conditions (e.g., different temperatures) can utilize a large amount of time if many different conditions of the test process for the memory devices to be tested.

In some conventional memory device testing systems, memory devices can be tested using a testing component that includes a temperature control component. The temperature control component is used to subject the memory device to a particular temperature condition. In some testing components, only a temperature control component is included and the memory device is not subjected to any other conditions during memory device testing. Multiple testing components can be included in a testing rack, where each testing component of the testing rack is coupled to a local testing module. The local testing module can facilitate testing for each memory sub-system coupled to a testing component of the testing rack. For example, the local testing module cause various operations to be performed for memory devices at multiple testing components at one or more temperature conditions. As the local testing module facilitates testing for each memory sub-system coupled to a testing component of the testing rack, an entire testing rack can be unusable during maintenance or failure of the single local testing module.

In some instances each testing rack can include hundreds of testing components. The local testing module can maintain a log of testing components available for testing of a memory device. As the log of testing components can include hundreds of entries (i.e., an entry for each testing component), significant memory resources can be used by the local testing module to maintain the log. The local testing module can reference the log of available testing components in response to each request for testing of a memory device at the memory rack. Each reference of the log can increase the latency of a testing process at the testing rack, thereby increasing the latency of the overall testing system.

Aspects of the present disclosure address the above and other deficiencies by providing an intelligent memory device test rack. A distributed test platform can include multiple memory device test racks. Each test rack can include multiple sections of two or more memory device test resources.

Each section of the test rack can include a processing device. In one example, a section of the test rack can be a test board of the test rack. The processing device can facilitate testing of memory devices included in memory sub-systems coupled to a memory device test resource of the section of the test rack. Each test resource includes one or more test condition components, one or more test resource monitoring components, and a memory sub-system interface port. A memory sub-system, including a memory device to be tested, can be coupled to a test resource of a section of the test rack by engaging with the memory sub-system interface port. In response to detecting the memory sub-system is coupled to the test resource, the processing device of the section of the test rack can transmit test instructions including one or more operations to be performed at the memory device. A memory sub-system controller of the memory sub-system can cause the one or more operations to be performed at the memory device. The memory sub-system controller can generate a set of test results for the performance of each operation at the memory device. After the operations are performed at the memory sub-system, the memory sub-system controller transmits the set of test results to the processing device of the section of the test rack.

Each test resource includes a test condition component. A test condition component can include at least one of a temperature controller or a voltage controller. A temperature controller is configured to control a temperature of the memory device during testing. The voltage controller is configured to control a voltage of a power supply signal provided to the memory sub-system during testing. The processing device of the section of the test rack can cause one or more conditions to occur at the test resource. For example, at least one of the temperature controller or the voltage controller can cause a first condition to occur prior to the initiation of testing at the memory device. During testing of the memory device, the temperature controller and/or the voltage controller can cause a second condition to occur. In response to detecting that the second condition has occurred, the memory sub-system controller can generate a second set of test results, where the second set of test results are related to the performance of an operation performed at the memory device operating at the second condition.

Advantages of the present disclosure include, but are not limited to, a decrease in an amount of time that the test platform is utilized to perform test of the memory devices. As many different tests can be performed at the test platform to test many different conditions (e.g., different temperatures, different power supply signal voltages, etc.) during the performance of many different sequences of operations, the testing of memory devices can be considered to be more robust as the reliability and performance of the memory devices can be tested by performing many different and concurrent tests. Further, as the processing device of the section of memory test resources of the test rack facilitates testing of a memory device, one or more other sections of the test rack can be available for testing of memory devices if the section is unavailable (e.g., for maintenance, etc.). Further, a log of available test resources is not maintained for each test resource of a test rack and therefore is not referenced in response to each request to test a memory device at a test resource of the test rack. As such, each test for each memory device can be performed in less time, thereby decreasing overall system latency. The reliability of the memory device can also increase as any potential defects of flaws can be identified and later addressed in the design or manufacturing of the memory devices that are to be available to customers.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a testing component 113 which performs tests on a memory device of sub-system 110, such as memory device 130. Memory sub-system 110 can couple to a memory device test resource of a section of a test rack, such as memory device test resources 312A-N of FIG. 3. In some embodiments, the section of the test rack can include a test board, such as test board 212 of FIG. 2. The section of the test rack can include a processing device allocated to facilitate memory device testing for each memory device test resource of the section of the test rack. Testing component 113 receives, from the processing device of the section of the test rack, one or more instructions for a test to be performed at memory device 130. The test instructions can include one or more operations to be performed at memory device 130, such as read operations, write operations and/or erase operations. Testing component 113 causes the performance of the one or more operations at memory device 130. During the performance of the one or more operations, testing component 113 collects data relating to the performance of the one or more operations. Testing component 113 generates a first set of test results based on the data collected during the performance of the one or more operations. In some embodiments, testing component 113 detects one or more conditions of memory sub-system 110 have changed during a performance of the one or more operations at memory device 130. For example, a temperature of memory sub-system 110 can increase from a first temperature to a second temperature during performance of the one or more operations. In some embodiments, a test condition component of the test resource can change the one or more conditions of memory sub-system 110. In such embodiments, testing component 113 generates a second set of test results based on the data collected during the performance of the one or more operations performed at the second condition. After testing component 113 generates the first set of test results and/or the second test of test results, testing component 113 transmits each set of test results to the processing device of the section of the test rack.

Figure 2:
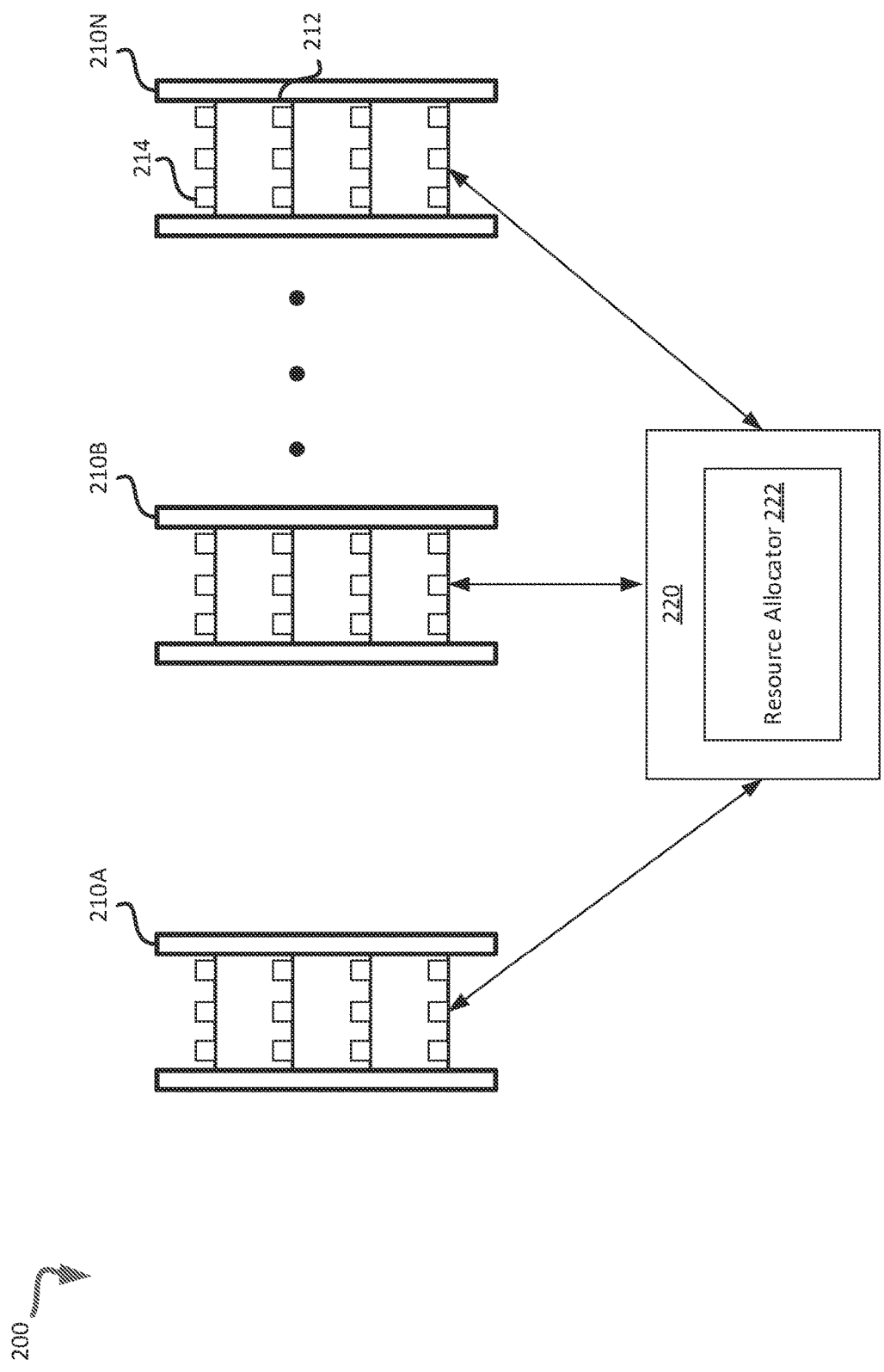
FIG. 2 is a test platform to perform a test of memory devices, in accordance with some embodiments of the present disclosure.

FIG. 2 illustrates a test platform 200 to perform a test of memory devices in accordance with some embodiments of the present disclosure. Test platform 200 can include one or more test racks 210A, 210B, and 210N. Each of the test racks 210A, 210B, and 210N (referred to as test racks 210) can include multiple test boards 212 where each test board 212 includes one or more test resources 214 (i.e., test sockets). The test platform 200 can include any number of test racks 210, test boards 212, or test resources 214. As shown, a test board 212 can include one or more test resources 214. Although three test resources 214 are shown, a test board 212 can include any number of test resources 214. Each test resource 214 can include a memory sub-system that has been coupled to the respective test resource 214.

One or more tests can be performed for a memory device of a memory sub-system that has been embedded with a test resource 214. Each test board 212 can include a separate and dedicated processing device that is used to facilitate testing of the memory device at each test resource 214 of the test board 212. For example, rather than there being a shared processing device for each rack 210, there can be an individual processing device for each test board 212. The processing device can receive instructions to be executed in performance of the test. The instructions can include one or more operations to be performed at a memory device of the memory sub-system. The instructions can also include one or more conditions to be applied to the memory sub-system during testing.

A resource allocator component 222 can receive (e.g., from a user) instructions including a sequence of one or more operations and/or conditions of the test that is to be performed for a memory device of a memory sub-system. Each processing device can keep a log of available test resources 214 included in the section of the test rack 210. The resource allocator component 222 can query each processing device of each test rack 210 to determine particular test resources 214 across the different test racks 210 that can be used to perform the test. In some embodiments, the resource allocator component 222 can be provided by a server 220 connected to each of the processing devices of test boards 212. In some embodiments, the server 220 is a computing device or system that is coupled with each processing device of each test resource 214 over a network.

In response to a memory sub-system being coupled to a particular test resource 214, resource allocator component 222 can transmit the received instructions to the processing device of the test board 212 including the particular test resource 214. In some embodiments, the resource allocator component 222 can transmit the received instructions to the processing device prior to the memory sub-system being coupled to the test resource 214. After the test has been performed for the memory device of the memory sub-system, the processing device of the test board 212 can transmit data associated with the results of the test to the resource allocator component 222, for transmission and/or presentation to the requesting user. The data associated with the results of the test can include data associated with the performance of the operations at the memory device of the memory sub-system. In some embodiments, the data associated with the results of the test can further include data associated with one or more conditions of the test resource 214 during the performance of the test.

In some instances, a processing device of a test board 212 can be unavailable to facilitate testing at a test resource 214 of the test board 212. For example, a test board 212 can lose power, making the processing device and each test resource 214 of the test board 212 unavailable. In another example, an error can occur at the processing device of the test board 212, therefore making each test resource 214 of the test board 212 unavailable. As each test board 212 of each test rack 210 includes a separate processing device allocated to the test resources 214 of the test board 212, a test resource 214 of another test board 212 can be used for testing in such instances. For example, a processing device of a first test board 212 can be unavailable to facilitate testing of a memory device. A second test board 212 can be identified, where the second test board 212 includes a processing device that is available to facilitate testing of the memory device. Memory devices of memory sub-systems can be tested at test resources 214 of the second test board 212 until the processing device of the first test board 212 is available to facilitate testing.

Figure 3:
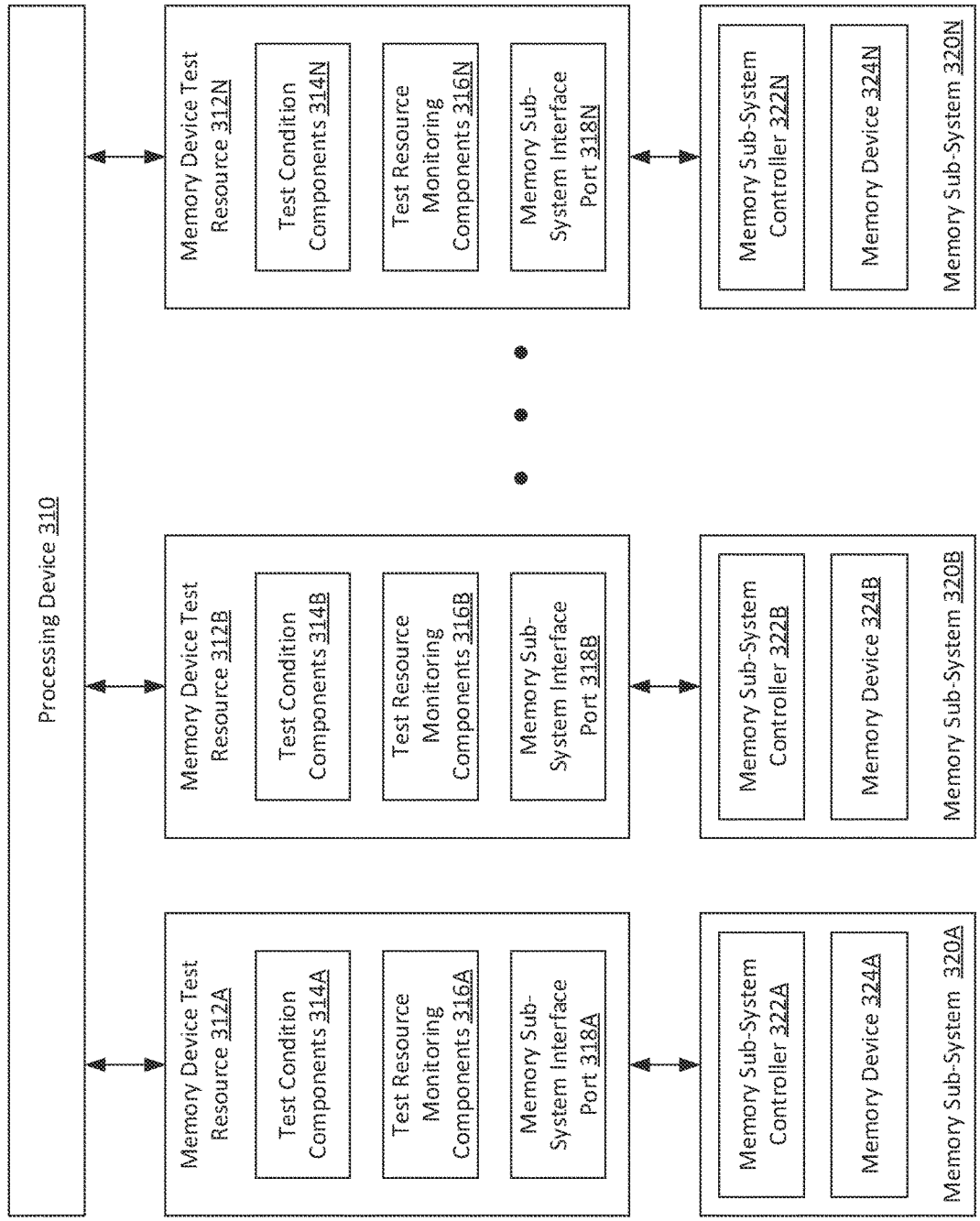
FIG. 3 is an example section of memory device test resources of a memory device test rack, in accordance with some embodiments of the present disclosure.

FIG. 3 is an example section of memory device test resources 312 of a memory device test rack, in accordance with some embodiments of the present disclosure. For example, memory device test resources, such as memory device test resource 312A, 312B, and/or 312N (referred to herein as test resources 312) can be one implementation of any of the memory device test resources 214 illustrated in FIG. 2. Each test resource 312 can be included in a section of a test rack, such as test rack 210. In some embodiments, a section of a test rack 210 can be a test board, such as test board 212. The section of test rack 210 can include a processing device 310 and two or more test resources 312. Each test resource 312 can include one or more test conditions components 314, one or more test resource monitoring components 316, and a memory sub-system interface port 318 (referred to herein as port 318).

As described previously, processing device 310 can facilitate testing of a memory device 324 of a memory sub-system 320 coupled to a test resource 312. Processing device 310 can receive one or more test instructions to be executed in the performance of a test of memory device 324. The one or more test instructions can include one or more operations to be performed at the memory device 324. In some embodiments, the one or more test instructions can further include one or more conditions to be applied to memory sub-system 320 during performance of the test.

Memory sub-system 320 can be coupled to test resource 312 by engaging with port 318. Port 318 can include a set of one or more serial input/output (IO) pins configured to couple to corresponding serial IO receptacles of memory sub-system 320. Port 318 can further include a set of one or more non-serial IO pins configured to couple to corresponding non-serial IO receptacles of memory sub-system 320. Further details regarding port 318 are further described with respect to FIG. 4.

In response to detecting that memory sub-system 320 has coupled to port 318, processing device 310 can cause a power supply signal to be provided to memory sub-system 320 via port 318 at a first voltage condition. In some embodiments, the power supply signal can include electricity. Processing device 310 can further transmit one or more test instructions, including one or more operations to be performed at memory device 324, to memory sub-system 320 via port 318.

In some embodiments, processing device 310 can cause memory sub-system 320 to initiate a re-boot process prior to the test being performed at memory device 324. In such embodiments, processing device can transmit a signal to memory sub-system controller 322, via port 318, instructing memory sub-system controller 322 to initiate the re-boot process. Memory sub-system controller 322, in response to receiving the signal, can initiate the re-boot process. Memory sub-system controller 322 can initiate the test after initiating the re-boot process. In other or similar embodiments, processing device 310 does not transmit a signal to memory sub-system controller 322 to initiate the re-boot process and instead can transmit a signal to memory sub-system controller 322, via port 318, instructing memory sub-system controller 322 to initiate the test at memory device 324. Memory sub-system controller 322 can initiate the test at memory device 324 in response to receiving the signal from processing device 310, via port 318.

Prior to the initiation of the test at memory device 324, processing device 310 can cause one or more conditions of test resource 312 to be applied to memory sub-system 320. In some embodiments, processing device 310 can cause the one or more test conditions to be applied to memory sub-system 320 in accordance with the one or more test instructions received from a resource allocator, such as resource allocator component 222 of FIG. 2. Test condition components 314 can generate the one or more test conditions. In some further embodiments, a test condition component 314 can include at least one of a temperature controller or a voltage controller. In some embodiments, the temperature controller can include one or more fans configured to cool ambient air surrounding the memory sub-system embedded within the test resource. In other or similar embodiments, the temperature controller can be a dual Peltier device (e.g., two Peltier devices) that utilize a Peltier effect to apply a heating or cooling effect at a surface of the dual politer device that is coupled to the memory sub-system. In another example, a voltage condition can be applied to the memory sub-system 320 by a voltage controller. In some embodiments, the voltage controller can include one or more power supplies configured to supply different voltages to the memory sub-system 320 via port 318.

In some embodiments, the one or more test instructions can include a first condition to be applied to memory sub-system during performance of the test. The first condition can be created by a test condition component 314 prior to or during performance of the test at memory device 324A. In some embodiments, the one or more test instructions can include at least a second condition to be applied to memory sub-system 320 during performance of the test at memory device 324. Test condition components 314 can cause the first condition to be changed to the second condition during testing of memory device 324.

Test resource monitoring components 316 can monitor one or more conditions within test resource 312. In some embodiments, test resource monitoring components 316 can monitor a condition generated by a test condition component 314. For example, a temperature monitoring component can measure a temperature of test resource 312, where the temperature is generated by a temperature controller of test resource 312. Test resource monitoring components 316 can include at least one of a temperature monitoring component configured to monitor a temperature of test resource 312, a voltage monitoring component configured to monitor a voltage of a power supply signal provided to memory sub-system 320 via port 318, a current monitoring component configured to monitor a current of the power supply signal provided to memory sub-system 320 via port 318, or a humidity monitoring component configured to monitor a humidity of test resource 312.

As described previously, memory sub-system controller 322 can receive one or more test instructions including one or more operations to be performed at memory device 324 from processing device 310. In response to receiving an instruction from processing device 310 to initiate the test at memory device 324, memory sub-system controller 322 can cause one or more operations of the received test instructions to be performed at memory device 324. Memory sub-system controller 322 can generate one or more sets of test results associated with the performance of the one or more operations at memory device 324. Memory sub-system controller 322 can generate at a first set of test results, in accordance with previously described embodiments.

In some embodiments, memory sub-system controller 322 can generate at least a second set of test results. As the one or more operations are performed at memory device 324, memory sub-system controller 322 can detect a change from a first condition to a second condition, where a test condition component 314 caused the change from the first condition to the second condition, in accordance with previously described embodiments. In some embodiments, memory sub-system controller 322 can detect the change in response to receiving a signal from processing device 310. In other or similar embodiments, memory sub-system controller 322 can detect the change in response to receiving a signal from a sensor of memory sub-system 320 that a condition of memory sub-system 320 has changed from the first condition to the second condition. In response to detecting the change from the first condition to the second condition, memory sub-system controller 322 can generate a second set of test results. The second set of test results can correspond to a performance of one or more operations of the test instructions at the second condition.

In some embodiments, two or more memory sub-systems 320 can be coupled to a respective test resource 312 of a section of a test rack. For example, a first memory sub-system, such as memory sub-system 320A can be coupled to a first test resource 312A and a second memory sub-system 320B can be coupled to a second test resource 312B. Processing device 310 can identify a first test to be performed at a first memory device 324A of memory sub-system 320A and a second test to be performed at a second memory device 324B of memory sub-system 320B. In some embodiments, instructions of the first test can include the same or a similar operations as included in the instructions of the second test. Processing device 310 can transmit instructions of the first test and the second test to memory sub-system 320A and memory sub-system 320B, respectively, in accordance with previously described embodiments. In some embodiments, processing device 310 can transmit a first signal to first memory sub-system 320A and a second signal to second memory sub-system 320B. A first memory sub-system controller 322A can cause the received instructions of the first test to execute in response to receiving the first signal. Similarly, a second memory sub-system controller 322B can cause the received instructions of the second test to execute in response to receiving the second signal. In some embodiments, the transmission of the first signal and the second signal can cause the instructions of the first test and the instructions of the second test to execute at first memory sub-system 320A and second memory sub-system 320B simultaneously. One or more test results for the first test and the second test can be generated, in accordance with previously described embodiments.

In response to completion of the test at memory device 324, memory sub-system controller 322 can transmit one or more sets of test results to processing device 310. In response to receiving the one or more sets of test results, processing device 310 can transmit each set of test results to another computing device, such as server 220 of FIG. 2, for transmission and/or presentation to a user requesting the test for memory device 324.

In some embodiments, processing device 310 can include a memory component (not shown) that is configured to store data associated with one or more conditions of the test resource 312 during the performance of the test at memory device 324. In such embodiments, processing device 310 can transmit, along with each set of test results, data associated with the one or more conditions of test resource 312 during the performance of the test for memory device 324.

Figure 4:
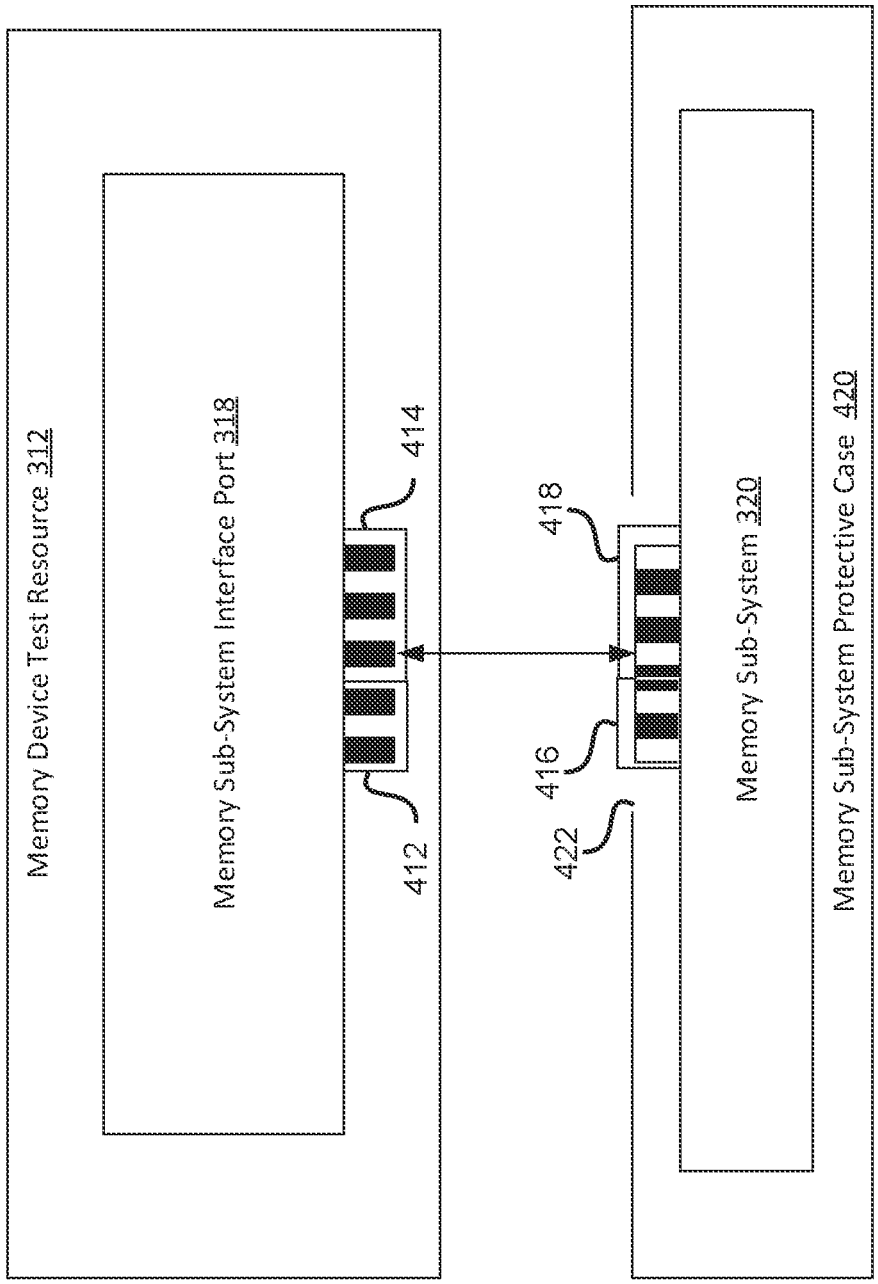
FIG. 4 is an example connection of a memory sub-system to a memory device test resource, in accordance with some embodiments of the present disclosure.

FIG. 4 is an example connection of a memory device test resource 312 to a memory sub-system 320, in accordance with some embodiments of the present disclosure. Port 318 can be configured to transmit a power supply signal to memory sub-system 320. Port 318 can be further configured to transmit to and/or receive instructions and data from memory sub-system 320.

Port 318 can include a first set of pins 412 that are configured to couple to a first set receptacles 416 of memory sub-system 320. Each of the first set of pins 412 can be configured to transmit a power supply signal (e.g., electricity) to memory sub-system 320. The first set of receptacles 416 can be configured to receive the power supply signal from test resource 312 transmitted via port 318. In some embodiments, each of the first set of pins 412 can be non-serial input/output (IO) pins. In other or similar embodiments, each of the first set of pins 412 can be pins of a high speed serial interface. For example, each of the first set of pins 412 can be configured to facilitate a peripheral component interconnect express (PCIe) protocol and/or a serial AT attachment (SATA) protocol In some embodiments, memory sub-system 320 can be enclosed in a protective case 420. The protective case 420 can have an opening 422 to expose the first set of receptacles 416 to the first set of pins 412 of test resource 312. The first set of pins 412 can be configured to connect to the first set of receptacles 416 via the opening 422 of the protective case 420.

Port 318 can further include a second set of pins 414. Each of the second set of pins 414 can be configured to transmit instructions and data between processing device 310 and memory sub-system 320. In some embodiments, each of the second set of pins 414 can be serial IO pins. In other or similar embodiments, each of the second set of pins 414 can be pins of a low speed serial interface. For example, each of the second set of pins 414 can be configured to facilitate a universal asynchronous receiver/transmitter (UART) protocol, a system management bus (SMB) protocol, or a serial wire debug (SWD protocol). Memory sub-system 320 some can include a second set of receptacles 418. In some embodiments, each of the second set of receptacles 418 can be serial IO receptacles. The second set of receptacles 418 can be configured to receive data from and/or transmit data to processing device 310. In some embodiments, opening 422 of protective case 420 can expose the second set of receptacles 418 to second set of pins 414 of port 318. The second set of pins 414 can be configured to couple to second set of receptacles 418 via the opening 422 of protective case 420.

Figure 5:
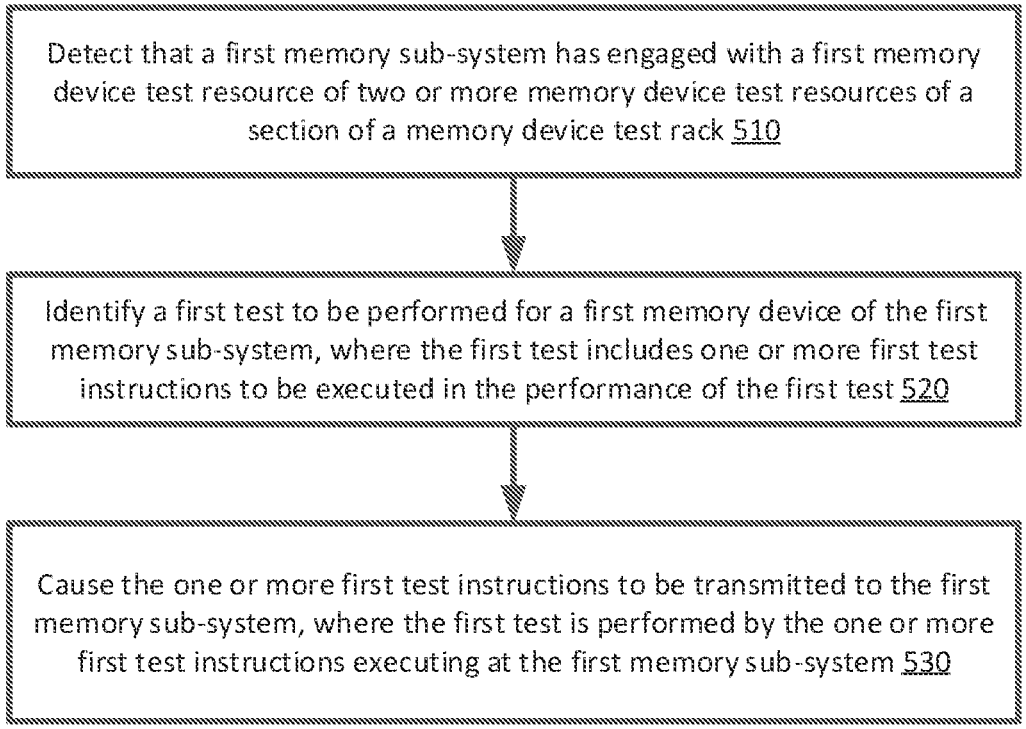
FIG. 5 is a flow diagram of an example method for an intelligent memory device test rack, in accordance with some embodiments of the present disclosure.

FIG. 5 is a flow diagram of an example method 500 for an intelligent memory device test rack, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by a processing device of a section of a test rack, such as processing device 310 of FIG. 3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing device 310 detects that a first memory sub-system has engaged with a first memory device test resource of a section of a memory device test rack. For example, the first memory sub-system can be memory sub-system 320A of FIG. 3. The first memory sub-system 320A can engage with the first test resource 312A via a memory sub-system interface port, such as port 318A. Port 318A can include one or more non-serial input/output (IO) pins, such as the first set of pins 412 of FIG. 4, configured to couple to corresponding receptacles, such as the first set of receptacles 416, of the first memory sub-system 320A. Each of the first set of pins 412 can be configured to transmit power from the first test resource 312A to the first memory sub-system 320A engaged with the first test resource 312A. Port 318A can further include one or more serial IO pins, such as the second set of pins 414, configured to couple to corresponding serial IO receptacles, such as the second set of receptacles 418, of the first memory sub-system 320A. The one or more serial IO pins of the second set of pins 414 can be configured to transmit data and instructions between the processing device 310 and the first memory sub-system 320A engaged with the first test resource 312A.

In some embodiments, the first memory sub-system 320A can be enclosed within a protective case, such as memory sub-system protective case 420. The protective case 420 can include an opening 422 configured to expose the first set of receptacles 416 and the second set of receptacles 418 of the first memory sub-system 320A to the first set of pins 412 and the second set of pins 414 of port 318A. The first set of pins 412 and the second set of pins 414 can be configured to couple to the first set of receptacles 416 and the second set of receptacles 418 via the opening 422 of the protective case 420.

At operation 520, the processing device 310 identifies a first test to be performed for a first memory device, such as first memory device 324A, of first memory sub-system 320A, where the first test includes one or more first test instructions to be executed in the performance of the first test. The first memory sub-system 320A can include a first memory sub-system controller, such as first memory sub-system controller 322A. The first memory sub-system controller 322A can be responsible for performing the test for the first memory device 324A. In some embodiments, the one or more first test instructions include one or more operations to be performed at the first memory device 324A, such as a read operation, a write operation, and/or an erase operation. The test instructions can further include conditions at which the test is to be performed under, referred to as a test condition. For example, the test instructions can include one or more temperature conditions and/or one or more voltage conditions to be applied to the first memory sub-system 320A during the performance of the test. In some embodiments, processing device 310 can further identify a second test to be performed for a second memory device, such as memory device 324B of memory sub-system 320B, where the second test includes one or more second test instructions to be executed in the performance of the second test.

Each test condition can be generated by a test condition component 314A of the first test resource 312A. For example, the memory sub-system 320A can be subjected to a temperature condition by a temperature controller. Test conditions can be monitored by one or more test resource monitoring components, such as test resource monitoring components 316A, of the first test resource 312A. For example, a temperature monitoring component can monitor a temperature of the first memory sub-system 320A during testing. In another example, a voltage monitoring component can monitor a voltage supplied to the first memory sub-system 320A via the port 318A. A test resource monitoring component 316A can also include a current monitoring component configured to monitor a current of power supplied to the first memory sub-system 320A via the port 318A. In other or similar embodiments, a test resource monitoring component 316A can include a humidity monitoring component configured to monitor a humidity of ambient air surrounding the first memory sub-system 320A during testing.

At operation 530, the processing device 310 causes the one or more first test instructions to be transmitted to the first memory sub-system 320A via port 318A, where the first test is performed by the one or more first test instructions executing at the first memory sub-system 320A. The memory sub-system controller 322A of the first memory sub-system 320A can receive the one or more first test instructions and cause one or more operations of the first test to be performed at the first memory device 324A. In some embodiments, the processing device 310 causes the operations to be performed at the first memory device 324A by transmitting a signal to the memory sub-system controller 322A via the port 318 to initiate performance of the operations at the first memory device 324A. In other or similar embodiments, the processing device 310 causes the operations to be performed at the first memory device 324A by transmitting a signal to cause the first memory sub-system controller 322A to initiate a re-boot process. The one or more operations can be performed in response to the first memory sub-system 320A initiating the re-boot process.

In some embodiments, the processing device 310 can transmit the instructions of the first test and the second test to the memory sub-system 320A and the memory sub-system 320B, respectively, in accordance with previously described embodiments. In some embodiments, the processing device 310 can transmit a first signal to the first memory sub-system 320A and a second signal to the second memory sub-system 320B. The first memory sub-system controller 322A can cause the received instructions of the first test to execute in response to receiving the first signal. Similarly, a second memory sub-system controller 322B can cause the received instructions of the second test to execute in response to receiving the second signal. In some embodiments, the transmission of the first signal and the second signal can cause the instructions of the first test and the instructions of the second test to execute at the first memory sub-system 320A and the second memory sub-system 320B simultaneously. One or more test results for the first test and the second test can be generated, in accordance with previously described embodiments.

The processing device 310 can receive, via the port 318, one or more sets of test results associated with the performance of the one or more operations at the first memory device 324A. Each set of test results can include at least one of performance characteristics or behaviors of the first memory device 324A while the test process is performed. The performance characteristics and/or the behaviors of the first memory device 324A can be observed by the first memory sub-system controller 322A while the one or more operations are being performed. In response to receiving the one or more sets of test results, the processing device 310 can transmit the test results to a server associated with a customer that requested the test of the memory device, such as server 220 of FIG. 2. In some embodiments, the processing device 310 can transmit, with the test results, data associated with one or more conditions monitored by a test resource monitoring component 316A of the first test resource 312A. For example, the processing device 310 can transmit data associated with at least one of a temperature of the first test resource 312A, a humidity of the first test resource 312A, a voltage of a power supply signal supplied to the first memory sub-system 320A, or a current of the power supply signal supplied to the first memory sub-system 320A during testing of the first memory device 324A.

Figure 6:
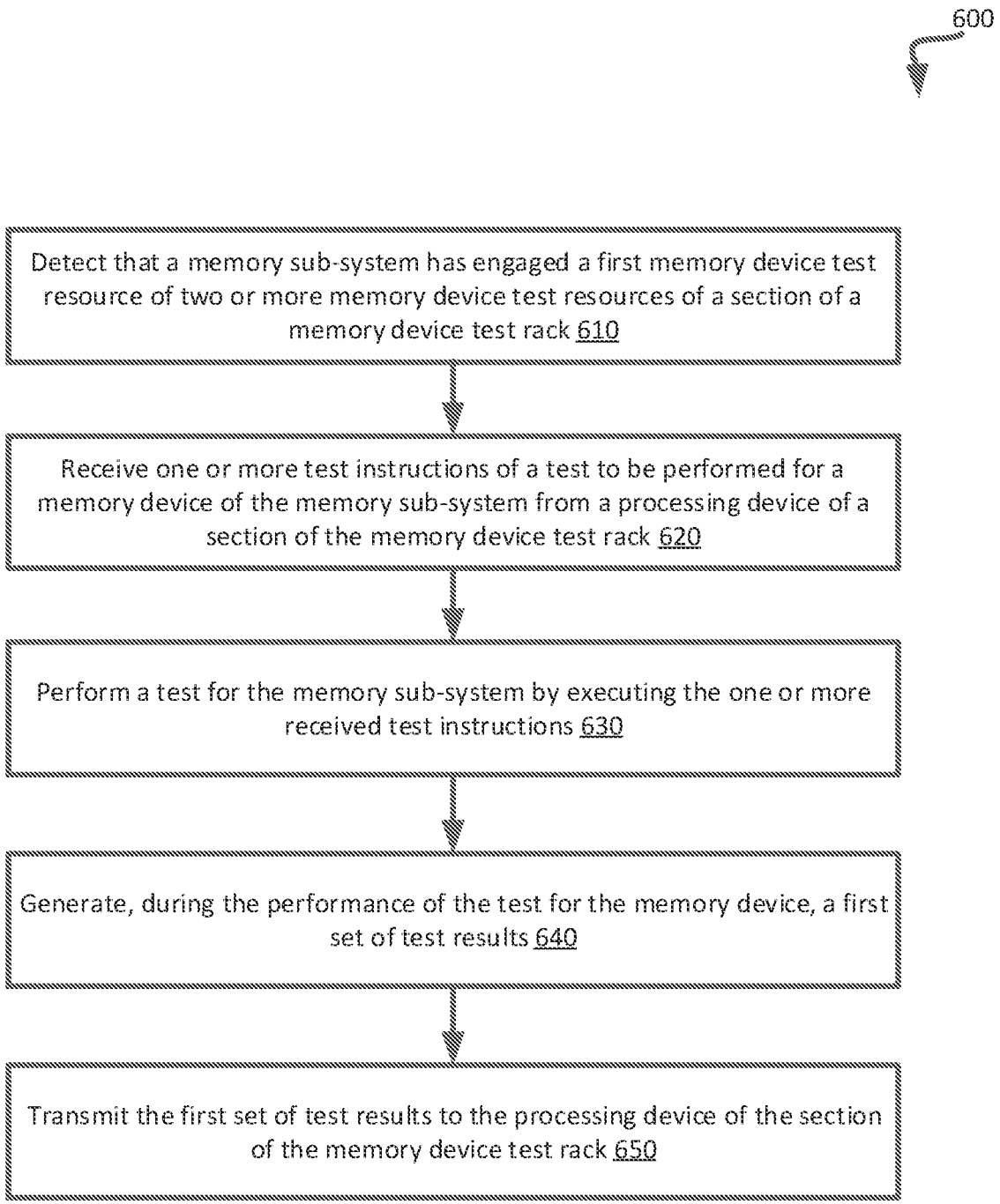
FIG. 6 is a flow diagram of an example method for a memory sub-system engaged with a memory device test resource of an intelligent memory device test rack, in accordance with some embodiments of the present disclosure.

FIG. 6 is a flow diagram of an example method 600 for a memory sub-system engaged with a memory device test resource of an intelligent memory device test rack, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the testing component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the testing component 113 detects that a memory sub-system, such as memory sub-system 320A of FIG. 3, has engaged with a first memory device test resource of two or more memory device test resources of a section of a memory device test rack, such as test resource 312A. The memory sub-system 320A can engage with the test resource 312A via a memory sub-system interface port, such as port 318A, in accordance with previously described embodiments.

At operation 620, the testing component 113 receives, via the port 318A, one or more test instructions of a test to be performed for a memory device, such as memory device 324A, of the memory sub-system 320A from a processing device, such as processing device 310, of a section of a memory device test rack. The one or more test instructions can include operations to be performed at the memory device 324A, in accordance with previously disclosed embodiments. The memory sub-system 320A can cause each operation of the one or more test instructions to be performed at the memory device 324A. In some embodiments, the memory sub-system 320A can cause each operation to be performed under various test conditions, temperature conditions or voltage conditions. The temperature conditions and/or the voltage conditions can be applied to the memory sub-system 320A by a test condition component, such as test condition component 314A, of the first test resource 312A, in accordance with previously described embodiments.

At operation 630, the testing component 113 performs a test for the memory device 324 by executing the one or more received test instructions. As previously described, a memory sub-system controller, such as memory sub-system controller 322A, can perform the test by causing the performance of the one or more operations of the received test instructions. In some embodiments, the memory sub-system controller 322A can perform the test at the memory device 324A in response to receiving, via the port 318A, a signal from the processing device 310 to initiate testing of the memory device 324A. In other or similar embodiments, the memory sub-system controller 322A can perform the test in response to initiating a re-boot process. The memory sub-system controller 322A can initiate the re-boot process in response to receiving a signal from the processing device 310, in accordance with previously described embodiments.

At operation 640, the testing component 113 generates, during the performance of the test, a first set of test results. As previously described, the one or more test instructions for the test can include conditions at which the memory sub-system 320A is to perform the test for the memory device under. In some embodiments, the conditions can include at least a first test condition, such as a first temperature condition and/or a first voltage condition. The first set of test results can correspond to a performance of the test under the first test condition. The memory sub-system controller 322A can generate a second set of test results corresponding to a performance of one or more operations of the test instructions at the second condition.

At operation 650, the testing component 113 transmits the first set of test results to the processing device 310 via the port 318. In some embodiments, the processing device 310 further transmits the second set of test results generated based on the performance of one or more operations at the second condition, in accordance with previously described embodiments. In response to receiving the first set of test results and/or the second set of test results, the processing device 310 can cause the received test results to be transmitted to a server, such as server 220 of FIG. 2, in accordance with previously described embodiments.

Figure 7:
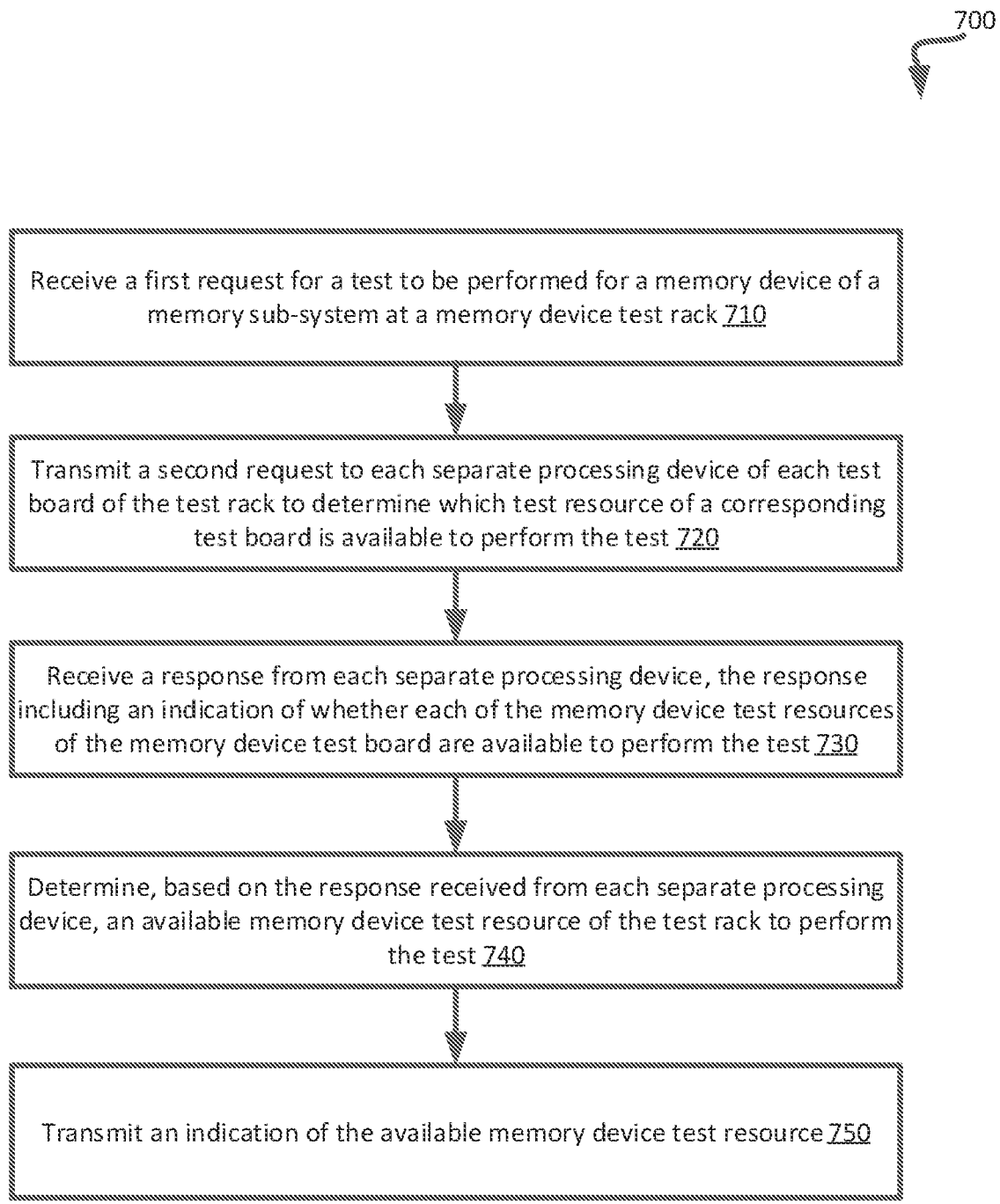
FIG. 7 is a flow diagram of an example method for a resource allocator operatively coupled to each processing device of a test board of a test rack, in accordance with some embodiments of the present disclosure.

FIG. 7 is a flow diagram of an example method 700 for a resource allocator operatively coupled to each processing device of a test board of a test rack, in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the resource allocator 222 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, the processing logic receives a first request for a test to be performed for a memory device of a memory sub-system at a memory device test rack. In some embodiments, the memory sub-system can be memory sub-system 320 of FIG. 3, and the memory device can be memory device 324. In some embodiments, the memory device test rack can be any of test rack 210A, B, or C of FIG. 2. The test rack 210 can include two or more memory device test boards, such as test boards 212. Each test board 212 can include two or more memory device test resources, such as test resources 312 of FIG. 3. Each test board 212 can include a processing device, such as processing device 310, where the processing device 310 is allocated to each test resource 312 of a corresponding test board 212. Each test resource 312 can include a test condition component, such as test condition component 314. In some embodiments, the first request can include one or more operations corresponding to a test condition to be applied to the memory sub-system 320 during the test.

At operation 720, the processing logic transmits a second request to each separate processing device 310 of each test board 212 of the test rack 210 to determine which test resource 312 of a corresponding test board 212 is available to perform the test. At operation 730, the processing logic receives a response from each separate processing device 310, the response including an indication of whether each of the test resources 312 of the test board 212 are available to perform the test. In some embodiments the response can include an indication of a test condition component 314 included in each test resource 312 of the test board 212. For example, the processing logic can receive, from a first processing device 310, a first response that indicates a first test resource 312 of a first test board 212 is available and the first test resource 312 includes a temperature controller and a voltage controller. The processing logic can also receive, from a second processing device 310, a second response that indicates a second test resource 312 of a second test board 212 is available and the second test resource 312 includes a temperature controller.

At operation 740, the processing logic determines, based on the response received from each separate processing device, an available test resource 312 of the test rack 212 to perform the test. In some embodiments, the available test resource 312 can be further determined based on an indication of whether the available test resource 312 includes a test condition component 314 configured to generate the test condition included in the first request. In accordance with the previous example, the first request can include one or more operations corresponding to a voltage of a power supply signal provided to the memory sub-system 320 by the available test resource 312. The processing logic can select the available test resource 312 for the test based on an indication of the first response that the first test resource 312 includes a voltage controller.

At operation 750, the processing logic transmits an indication of the available test resource 312. In response to receiving an indication of the available test resource 312, the memory sub-system can be coupled to the available test resource 312 for testing. For example, the processing logic can transmit the indication of the available test resource 312 to an operator of the test rack 210. In response to receiving the indication, the operator can cause the memory sub-system 320 to be coupled to the available test resource 312 for testing.

Figure 8:
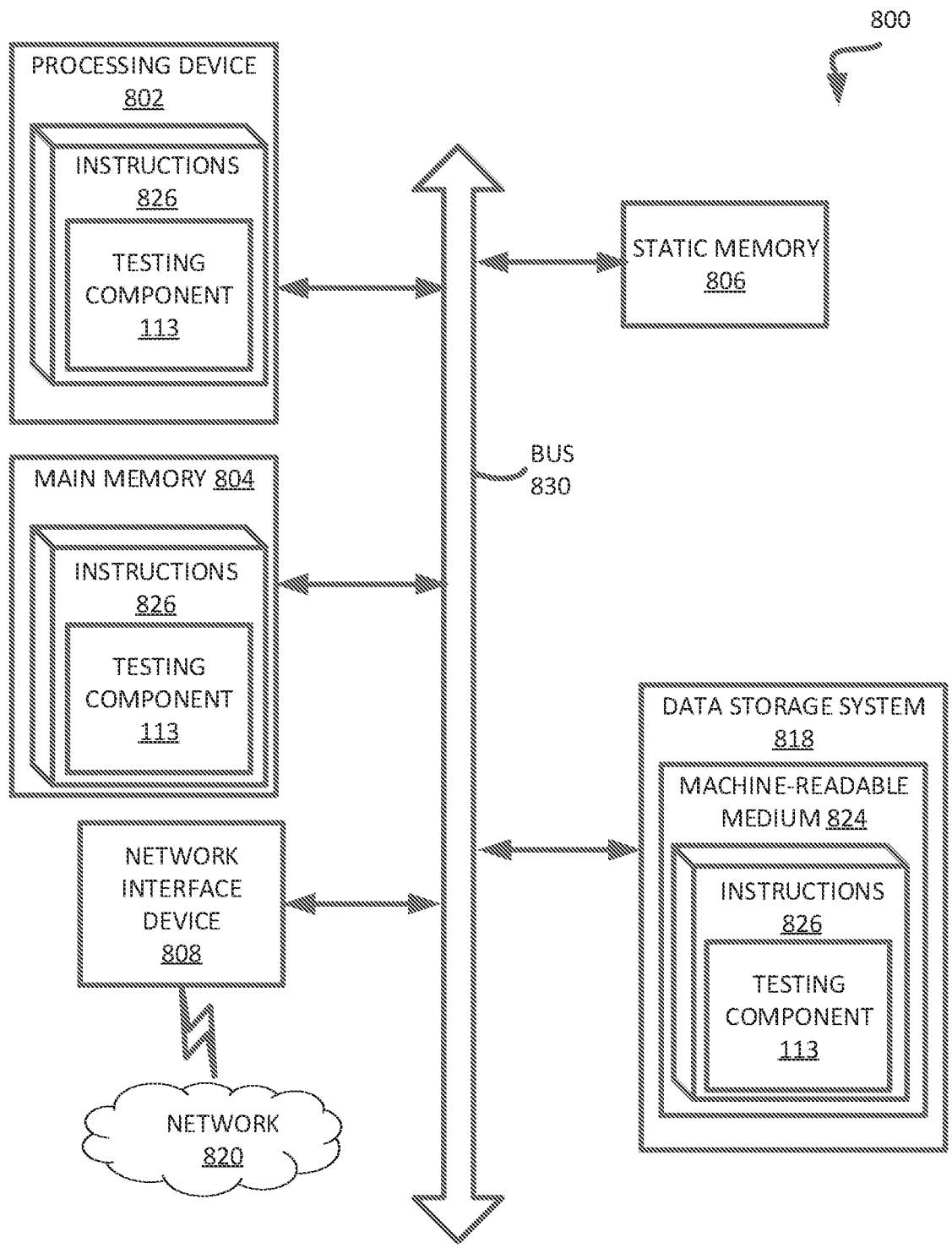
FIG. 8 is a block diagram of an example computer system, in which embodiments of the present disclosure may operate.

In some embodiments, the processing logic can receive one or more operations to be performed during the test for the memory device. The operations can include a test condition generated by a test condition component 314 of the available test resource 312. In some embodiments, the test condition can include a temperature of ambient air surrounding the memory sub-system 320 or a voltage of a power supply signal provided to the memory sub-system 312. The operations can further include or one or more of a read operation, a write operation, or an erase operation performed at the memory device 324 during the test. In response to receiving the one or more operations, the processing logic can transmit one or more test instructions including the one or more operations to the processing device 310 allocated to the available test resource 312. In some embodiments, the one or more test instructions can be generated by the processing logic. In some embodiments, the one or more test instructions are transmitted to the processing device 310 in response to receiving an indication that the memory sub-system 320 has coupled to the available test resource 312 via a memory sub-system interface port, such as port 318, of the available test resource 312. FIG. 8 illustrates an example machine of a computer system 800 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the testing component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to a testing component (e.g., the testing component 113 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    detecting, by a processing device allocated to a memory device test board of a distributed test platform, that a memory sub-system has engaged with a memory device test resource of the memory device test board, the memory device test resource separately allocated for the memory sub-system engaged with the memory device test resource and comprising a plurality of test condition components that are designated for the memory device test resource, wherein the plurality of test condition components comprise a temperature controller that is configured to apply a test temperature condition and a voltage controller that is configured to apply a test voltage condition to the memory sub-system engaged with the memory device test resource in isolation from other memory device test resources of the memory device test board;
    identifying, by the processing device, a test to be performed for a memory device of the memory sub-system, wherein the test comprises first instructions to be executed by a memory sub-system controller of the memory sub-system in performance of the test and second instructions to be executed by the processing device in performance of the test, wherein the second instructions are to cause the plurality of test condition components of the memory device test resource to generate at least the test temperature condition and the test voltage condition to be applied to the memory device while the memory sub-system controller executes the first instructions;
    responsive to transmitting the first instructions to the memory sub-system controller, executing the second instructions; and
    receiving, from one or more test resource monitoring components of the memory device test resource, additional data associated with the test performed for the memory device, wherein the additional data indicates two or more of a temperature of the test resource during the performance of the test, a voltage of a power supply signal provided to the memory device during the performance of the test, a current of the power supply signal provided to the memory device during the performance of the test, or a humidity of an environment of the memory device test resource during the performance of the test.

2. The method of claim 1, further comprising:
    transmitting a signal to the memory sub-system controller, wherein the signal causes the memory sub-system controller to execute the first instructions.

3. The method of claim 2, wherein the signal is transmitted to the memory sub-system controller responsive to executing the second instructions.

4. The method of claim 1, further comprising:
    receiving, from the memory sub-system, a set of test results for the test performed for the memory device.

5. The method of claim 1, further comprising:
    detecting that an additional memory sub-system has engaged with an additional memory device test resource of the memory device test board;

identifying an additional test to be performed for an additional memory device of the additional memory sub-system, the additional test comprising third instructions to be executed by an additional memory sub-system controller of the additional memory sub-system in performance of the additional test; and transmitting the third instructions to the additional memory sub-system controller.

6. A system comprising:

a memory device; and a processing device allocated to a memory device test board of a distributed test platform, the processing device operatively coupled to the memory device and to perform operations comprising:

detecting that a memory sub-system has engaged with a memory device test resource of the memory device test board, the memory device test resource separately allocated for the memory sub-system engaged with the memory device test resource and comprising a plurality of test condition components that are designated for the memory device test resource, wherein the plurality of test condition components comprise a temperature controller that is configured to apply a test temperature condition and a voltage controller that is configured to apply a test voltage condition to the memory sub-system engaged with the memory device test resource in isolation from other memory device test resources of the memory device test board;

identifying a test to be performed for a memory device of the memory sub-system, wherein the test comprises first instructions to be executed by a memory sub-system controller of the memory sub-system in performance of the test and second instructions to be executed by the processing device in performance of the test, wherein the second instructions are to cause the plurality of test condition components of the memory device test resource to generate at least the test temperature condition and the test voltage condition to be applied to the memory device while the memory sub-system controller executes the first instructions;

responsive to transmitting the first instructions to the memory sub-system controller, executing the second instructions; and receiving, from one or more test resource monitoring components of the memory device test resource, additional data associated with the test performed for the memory device, wherein the additional data indicates two or more of a temperature of the test resource during the performance of the test, a voltage of a power supply signal provided to the memory device during the performance of the test, a current of the power supply signal provided to the memory device during the performance of the test, or a humidity of an environment of the memory device test resource during the performance of the test.

7. The system of claim 6, wherein the processing device is to perform operations further comprising:

transmitting a signal to the memory sub-system controller, wherein the signal causes the memory sub-system controller to execute the first instructions.

8. The system of claim 7, wherein the signal is transmitted to the memory sub-system controller responsive to executing the second instructions.

9. The system of claim 6, wherein the operations further comprise:

receiving, from the memory sub-system, a set of test results for the test performed for the memory device.

10. A non-transitory computer readable medium comprising instructions, which when executed by a processing device allocated to a memory device test board of a distributed test platform, cause the processing device to perform operations comprising:

detecting that a memory sub-system has engaged with a memory device test resource of the memory device test board, the memory device test resource separately allocated for the memory sub-system engaged with the memory device test resource and comprising a plurality of test condition components that are designated for the memory device test resource, wherein the plurality of test condition components comprise a temperature controller that is configured to apply a test temperature condition and a voltage controller that is configured to apply a test voltage condition to the memory sub-system engaged with the memory device test resource in isolation from other memory device test resources of the memory device test board;

identifying a test to be performed for a memory device of the memory sub-system, wherein the test comprises first instructions to be executed by a memory sub-system controller of the memory sub-system in performance of the test and second instructions to be executed by the processing device in performance of the test, wherein the second instructions are to cause the plurality of test condition components of the memory device test resource to generate at least the test temperature condition and the test voltage condition to be applied to the memory device while the memory sub-system controller executes the first instructions;

responsive to transmitting the first instructions to the memory sub-system controller, executing the second instructions; and receiving, from one or more test resource monitoring components of the memory device test resource, additional data associated with the test performed for the memory device, wherein the additional data indicates two or more of a temperature of the test resource during the performance of the test, a voltage of a power supply signal provided to the memory device during the performance of the test, a current of the power supply signal provided to the memory device during the performance of the test, or a humidity of an environment of the memory device test resource during the performance of the test.

11. The non-transitory computer readable medium of claim 10, wherein the operations further comprise:

transmitting a signal to the memory sub-system controller, wherein the signal causes the memory sub-system controller to execute the first instructions.

12. The non-transitory computer readable medium of claim 11, wherein the signal is transmitted to the memory sub-system controller responsive to executing the second instructions.

13. The non-transitory computer readable medium of claim 10, wherein the operations further comprise:

receiving, from the memory sub-system, a set of test results for the test performed for the memory device.

14. The method of claim 1, wherein the one or more test conditions to be applied to the memory device comprises a temperature test condition associated with a temperature of an environment of the memory device test resource and at least one of a voltage test condition associated with a voltage applied to the memory device or a current test condition associated with a current applied to the memory device, and
wherein executing the second instructions comprises transmitting one or more signals to the one or more test condition components to cause the temperature of the environment of the memory device test resource to correspond to the temperature test condition and at least one of the voltage applied to the memory device to correspond to the voltage test condition or the current applied to the memory device to correspond to the current test condition.

15. The method of claim 1, further comprising:
transmitting, by the processing device, a signal to a computing device, wherein the signal comprises a set of test results for the test performed for the memory device for presentation to a user of the computing device.

16. The method of claim 15, wherein the signal further comprises the additional data indicating two or more of the temperature of the test resource during the performance of the test, the voltage of the power supply signal provided to the memory device during performance of the test, the current of the power supply signal provided to the memory device during the performance of the test, or the humidity of the environment of the memory device test resource during the performance of the test.

17. The system of claim 6, wherein the operations further comprise:
transmitting a signal to a computing device, wherein the signal comprises a set of test results for the test performed for the memory device for presentation to a user of the computing device.

18. The system of claim 17, wherein the signal further comprises the additional data indicating two or more of the temperature of the test resource during the performance of the test, the voltage of the power supply signal provided to the memory device during performance of the test, the current of the power supply signal provided to the memory device during the performance of the test, or the humidity of the environment of the memory device test resource during the performance of the test.

19. The non-transitory computer readable medium of claim 10, wherein the operations further comprise:
transmitting a signal to a computing device, wherein the signal comprises a set of test results for the test performed for the memory device for presentation to a user of the computing device.

20. The non-transitory computer readable medium of claim 19, wherein the signal further comprises the additional data indicating two or more of the temperature of the test resource during the performance of the test, the voltage of the power supply signal provided to the memory device during performance of the test, the current of the power supply signal provided to the memory device during the performance of the test, or the humidity of the environment of the memory device test resource during the performance of the test.

* * * * *